(12) United States Patent
Tazoe et al.

(10) Patent No.: US 7,393,715 B2
(45) Date of Patent: Jul. 1, 2008

(54) MANUFACTURING METHOD FOR IMAGE PICKUP APPARATUS

(75) Inventors: Koichi Tazoe, Hadano (JP); Sakae Hashimoto, Sagamihara (JP); Akira Ohtani, Ebina (JP); Hiroshi Yuzurihara, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 193 days.

(21) Appl. No.: 11/275,672

(22) Filed: Jan. 24, 2006

(65) Prior Publication Data
US 2006/0172450 A1 Aug. 3, 2006

(30) Foreign Application Priority Data
Jan. 28, 2005 (JP) ............................... 2005-021276

(51) Int. Cl.
*H01L 21/00* (2006.01)
(52) U.S. Cl. .............................. 438/57; 438/96; 438/97; 438/482; 438/488; 257/E31.001; 257/E25.009
(58) Field of Classification Search .................... 438/57
See application file for complete search history.

(56) References Cited

U.S. PATENT DOCUMENTS

| | | | |
|---|---|---|---|
| 4,731,665 A | 3/1988 | Hashimoto et al. ...... 358/213.27 |
| 4,816,910 A | 3/1989 | Hashimoto et al. ...... 358/213.27 |
| 4,959,723 A | 9/1990 | Hashimoto ............. 358/213.11 |
| 4,962,412 A | 10/1990 | Shinohara et al. ............. 357/30 |
| 5,051,831 A | 9/1991 | Hashimoto ............. 358/213.11 |
| 5,060,042 A | 10/1991 | Shinohara et al. ............. 357/30 |
| 5,146,339 A | 9/1992 | Shinohara et al. ............ 358/212 |
| 5,283,428 A | 2/1994 | Morishita et al. ......... 250/214.1 |
| 6,114,243 A * | 9/2000 | Gupta et al. ................. 438/687 |
| 6,239,500 B1 * | 5/2001 | Sugimachi ................... 257/203 |
| 7,019,373 B2 | 3/2006 | Hashimoto ................... 257/432 |
| 7,126,102 B2 | 10/2006 | Inoue et al. .................. 250/214 |
| 2005/0191852 A1* | 9/2005 | Takigawa et al. ............ 438/637 |
| 2006/0038209 A1 | 2/2006 | Hashimoto ................... 257/249 |
| 2006/0043442 A1 | 3/2006 | Yuzurlhara et al. .......... 257/292 |
| 2006/0138577 A1 | 6/2006 | Hashimoto ................... 257/432 |
| 2006/0208160 A1 | 9/2006 | Mishima et al. ........... 250/208.1 |
| 2007/0018080 A1 | 1/2007 | Inoue et al. .................. 250/214 |

FOREIGN PATENT DOCUMENTS

JP 2001-352049 12/2001
JP 2002-231915 8/2002

* cited by examiner

*Primary Examiner*—Walter Lindsay, Jr.
*Assistant Examiner*—Abdulfattah Mustapha
(74) *Attorney, Agent, or Firm*—Fitzpatrick, Cella, Harper & Scinto

(57) ABSTRACT

In an image pickup device, a step of forming an embedded plug includes a step of forming a connecting hole in the insulation film in which the embedded plug is to be formed, a metal layer deposition step of depositing a metal layer on the insulation film in which the connecting hole is formed, thereby covering an interior of the connecting hole and at least a part of an upper surface of the insulation film in a laminating direction thereof, and a metal layer removing step of polishing the upper surface of the insulation film on which the metal layer is deposited thereby removing the metal layer except for the interior of the connecting hole, an etch-back method performed on the embedded plug in at least an insulation film, and a chemical mechanical polishing method performed on the embedded plug in another insulation film.

8 Claims, 5 Drawing Sheets

A

MANUFACTURING METHOD FOR IMAGE PICKUP APPARATUS

BACKGROUND OF THE INVENTION

1. Field of the Invention

The present invention relates to a manufacturing method for an image pickup apparatus, and more particularly to a producing method for a MOS image pickup apparatus.

2. Related Background Art

As a photoelectric converting device for use in a digital still camera or a digital video camera, a CMOS area sensor is often employed. In a CMOS area sensor, electrical signals generated by photoelectric conversion by a plurality of photodiodes provided on a semiconductor substrate are read by MOS transistors. It has, for example, a following structure as disclosed in Japanese Patent Application Laid-Open No. 2002-231915. On an N-type silicon semiconductor substrate, a well is formed by diffusing a P-impurity, and an N-impurity diffusion area of a photodiode is formed in such P-well. A charge generated by a photoelectric conversion is accumulated in the N-impurity diffusion area. Subsequently, the charge is transferred, by a gate electrode of a charge-transferring MOS transistor, to a drain area (floating diffusion area), constituted of an N-impurity diffusion area, of the transfer MOS transistor. Such photodiode, gate electrode and drain area are covered by a first insulation film. A first wiring layer is provided on the first insulation film and is connected with an impurity diffusion area such as the drain area of the transfer MOS transistor, through a contact plug penetrating the first insulation film. On the first wiring layer, there are similarly provided a second insulation film, a second wiring layer, a third insulation film and a third wiring layer. The first and second wiring layers are connected by a via plug penetrating the second insulation film, and the second and third wiping layers are connected by a via plug penetrating the third insulation film. The gate electrode is also connected by a similar wiring structure. Such contact plug and via plug are often formed by tungsten. On the third insulation film, a passivation film for device protection is provided, and a color filter and a microlens for sensitivity improvement are provided on the passivation film.

The CMOS area sensor of such structure is prepared by at first forming a lowermost part such as the photodiode, then forming a first insulation film, and forming a contact plug penetrating the first insulation film. The process is following by forming a first wiring layer, then forming a second insulation film in a similar manner, and forming a via plug penetrating the second insulation film. It is then followed by forming a second wiring layer, forming a third insulation film in a similar manner, forming a via plug penetrating the third insulation film and forming a third wiring layer.

For forming a contact plug or a via plug, a connecting hole is formed in the insulation film by a photolithographic process and an etching process. Then a high-melting metal or alloy film such as of tungsten is formed on the insulation film by a blanket chemical vapor deposition (CVD). The blanket CVD process causes a metal film deposition on a surface bearing the connecting hole, and fills the interior of the connecting hole with a metal film. Thereafter the metal film is removed except for the connecting hole to obtain a contact plug or a via plug. At the same time the insulation film is planarized.

For removing the metal film except in the interior of the connecting hole and planarizing the insulation film, following methods are known. Japanese Patent Application Laid-Open No. 2003-204055 discloses an etch-back method for planarizing irregularities of a film by an etching, and Japanese Patent Application Laid-Open No. 2001-352049 discloses a chemical-mechanical polishing (CMP). In the prior technology, such etch-back method or CMP method has always been selected for removing the metal film on the insulation film.

The etch-back method, when employed for forming a contact plug or a via plug, allows to attain a uniform flatness on the insulation film, but is unable to completely remove a residue of the metal film, caused in the etching process, thereby causing a possibility of shortcircuiting on the wiring layer to be formed thereon.

On the other hand, the CMP method, when employed for forming a contact plug or a via plug, can remove protruding extraneous matters deposited in the steps up to the metal film formation and can reduce the possibility of shortcircuiting of the wirings in comparison with the case of the etch-back method. However, since the insulation film is also polished together with the contact plug or the via plug, a polishing unevenness is caused depending on a CMP apparatus and a polishing pattern.

Because of such polishing unevenness, the insulation to be positioned between the photodiode and the color filter becomes uneven in the thickness for example between a central part and an edge part of a sensor chip. Particularly in an image pickup device, the incident light amount entering the photodiodes becomes uneven, thereby leading to a deterioration in the sensor characteristics, such as an unevenness in color. Particularly a thickness unevenness in the uppermost insulation, in the laminating direction, may influence significantly the sensor characteristics.

SUMMARY OF THE INVENTION

The present invention provides a method of manufacturing an image pickup device comprising an image pickup area having plural photoelectric conversion elements arranged in a semiconductor substrate and transistors for transferring electrical signals from the each photoelectric conversion elements, multi-layer wiring structure arranged above the semiconductor substrate wiring layer, plural interlayer insulation films arranged between the wiring and between the image pickup area and the wiring layer, and plural buried plugs each arranged penetrating one of the interlayer insulation film for electrically connecting the wiring mutually adjacent in the direction of lamination or the wiring and a part of the image pickup area, the method comprises:

a step of forming the embedded plugs, which comprises:

a step of forming a connecting hole in the interlayer insulation film in which the buried plug is to be formed;

a metal layer deposition step of depositing a metal layer on the interlayer insulation film in which the connecting hole is formed, so as to bury an interior of the connecting hole and to cover at least a part of an upper surface of the interlayer insulation film in a laminating direction thereof; and a metal layer removing step of removing at least a part of the metal layer on the upper surface of the interlayer insulation film to form the buried plug;

wherein the metal layer removing step is executed by an etch-back method on the buried plug in at least an uppermost interlayer insulation film in the laminating direction and by a chemical mechanical polishing method on the buried plug other than the buried plug formed by the etch-back method.

The present invention also provides a method of manufacturing an image pickup device comprising an image pickup area having plural photoelectric conversion elements arranged in a semiconductor substrate, transistors for transferring electrical signals from the each photoelectric conversion elements, multi-layer wiring structure arranged above the semiconductor substrate, plural interlayer insulation films arranged between the wiring layers and between the image pickup area and the wiring layer, plural buried plugs each arranged penetrating one of the interlayer insulation film for electrically connecting the wiring mutually adjacent in the direction of lamination or the wiring and a part of the image pickup area, and a passivation layer arranged on the uppermost insulation film in the laminating direction, the method comprising:

a step of forming the buried plugs, which comprises:

a step of forming a connecting hole in the interlayer insulation film in which the buried plug is to be formed;

a metal layer deposition step of depositing a metal layer on the interlayer insulation film in which the connecting hole is formed, so as to bury an interior of the connecting hole and to cover at least a part of an upper surface of the interlayer insulation film in a laminating direction thereof; and a metal layer removing step of removing at least a part of the metal layer on the upper surface of the interlayer insulation film to form the buried plug;

wherein the metal layer removing step is executed by an etch-back method on the buried plug in at least an uppermost interlayer insulation film in the laminating direction and by a chemical mechanical polishing method on the buried plug other than the buried plug formed by the etch-back method; and a step of forming passivation layer on the uppermost insulation film in the laminating direction.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

First Embodiment

Figure 1:
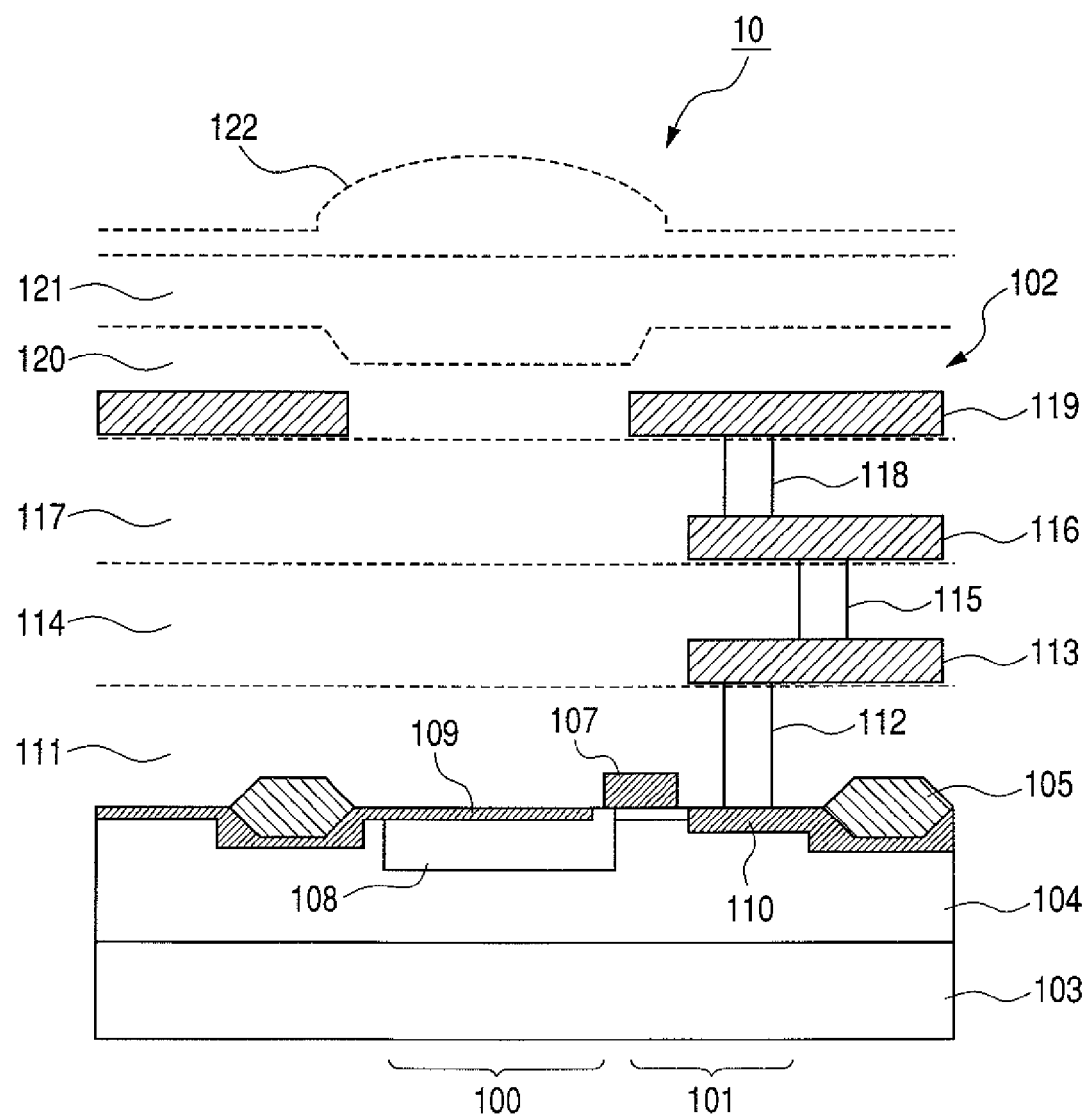
FIG. 1 is a cross-sectional view of a CMOS area sensor of a first embodiment.

At first, there will be explained a basic configuration of an image pickup device relating to a producing method of the present embodiment for an image pickup device. FIG. 1 is a schematic cross-sectional view of a pixel of the image pickup device. An aforementioned CMOS sensor will be explained as an example of the image pickup device. A CMOS sensor means a sensor in which an image pickup area and a peripheral circuit area are formed by approximately same processes (CMOS process). The CMOS area sensor 10 includes a photodiode 100 formed on a silicon semiconductor substrate 103 (hereinafter also merely called substrate) and serving as a photoelectric conversion element, and a transfer MOS transistor 101 for transferring an electrical signal from the photoelectric conversion element. It is also provided with a wiring layer 102 including a wiring for providing MOS transistors such as the transfer MOS transistor 101 with a driving bias, a wiring for transferring a photoelectrically converted charge to a peripheral signal processing circuit, a power supply wiring for supplying a desired voltage, and a wiring for light shielding. In addition to the transfer MOS transistor, there are provided an amplifying MOS transistor, a resetting MOS transistor, a pixel selecting MOS transistor and the like, according to the necessity. The photodiode 100 and the transfer MOS transistor 101 constitute a light-receiving area of the CMOS area sensor 10.

In FIG. 1, the photodiode 100 indicates, for the purpose of simplicity, merely an area where a photodiode is formed. Also the transfer MOS transistor 101 in FIG. 1 indicates an area where the transfer MOS transistor is formed.

A more specific structure is as follows. On a P-well 104 formed on an N-silicon semiconductor substrate 103, there is formed an N-impurity diffusion area 108 for a charge accumulation, on which a surfacial P-impurity diffusion area 109 is formed so as to obtain a photodiode of an embedded structure. Also a train area 110 of the transfer MOS transistor 101 is formed opposite to the N-impurity diffusion area 108 across a gate electrode 107 of the transfer MOS transistor. The drain area 110, constituted of an N-impurity diffusion area, serves also as a floating diffusion area for retaining a transferred charge and outputting it as a converted voltage. The structure is separated from another pixel by a field oxide film 105.

The photodiode 100 and the transfer MOS transistor 101 are covered by a first insulation film 111 formed by a silicon oxide film, on which a first wiring layer 113 is provided. A wiring of the first wiring layer, not connected with the gate electrode, is insulated from the gate electrode 107 by the first insulation film 111. The first wiring layer 113 includes a wiring connected with the drain area 110 by a contact plug 112 penetrating the first insulation film 111.

The first wiring layer 113 is similarly covered by a second insulation film 114, on which a second wiring layer 116 is formed. Thus the second wiring layer 116 is insulated from the first wiring layer 113 but is connected therewith in a predetermined position by a via plug 115 penetrating the second insulation film 114. The second wiring layer 116 is similarly covered by a third insulation film 117, on which a third wiring layer 119 is formed. Thus the third wiring layer 119 is insulated from the second wiring layer 116 but is connected therewith in a predetermined position by a via plug 118 penetrating the third insulation film 117.

Therefore the CMOS area sensor 10 includes plural wiring layers 113, 116, 119 provided in mutually different heights in a laminating direction, plural insulation films provided between the wiring layers mutually adjacent in the laminating direction, and plural embedded plugs each provided penetrating each corresponding insulation film for electrically connecting the wiring layers mutually adjacent in the laminating direction or the wiring layer and a part of the image pickup area. The CMOS area sensor has a laminated wiring structure. An insulating film between the laminated wirings is referred as an interlayer insulating film. Moreover, there may be a configuration of a structure that on a upper most wiring layer, a further insulating layer is disposed.

The CMOS area sensors 113, 116, 119 are constituted of aluminum, while the contact plug 112 and the via plugs 115, 118 are constituted of tungsten. In the present specification, the contact plug 112 and the via plugs 115, 118 may be collectively called an embedded plug.

The third wiring layer 119 is covered by a passivation film 120 for substrate protection. The passivation film 120 is formed by a silicon nitride film because it is suitable for device protection and because it is rich in hydrogen, which terminates a dangling bond of silicon on the surface of the semiconductor substrate. This allows to reduce a dark current which is induced by a dangling bond and constitutes a drawback particularly in an image pickup device.

Also between the passivation film 120 and the third insulation film of silicon oxide film, there may be formed a silicon oxinitride film having a refractive index between those of the two films. Such silicon oxinitride film allows to suppress a light, guided to the photodiode 100, from being reflected by an interface between the passivation film 120 and the third insulation film 117 formed by a silicon oxide film. It is thus possible to reduce a deterioration in the sensor characteristics, such as a color unevenness, induced by an intrusion of thus reflected light into a neighboring photodiode 110. Thus the silicon oxinitride film functions as an antireflection film for reducing the reflection induced in such interface.

Above the passivation film 120, a color filter layer 121 and a microlens layer 122 for sensitivity improvement are formed. The color filter layer 121 includes three primary colors of red, green and blue, respectively corresponding to the photodiodes 100.

A light entering from the surface of the CMOS area sensor 100 passes the color filter layer 121, thereby being selectively separated into wavelengths respectively corresponding to spectral sensitivities. It then passes an aperture where the third wiring layer 119 is absent, and reaches the photodiode 100 after repeating reflection and transmission. The arriving light is absorbed in the N-impurity diffusion area 108 or in the P-well 104 of the photodiode 100, thereby generating an electron-hole pair. The electron is transferred, at a suitable timing, to the drain area 110 by the gate electrode 107 of the transfer MOS transistor. Then it is transferred through the wiring layer 103 constituted of a contact plug 112 and the first wiring layer 113 and read through a predetermined path. In case an amplifying element is provided in a pixel, the floating diffusion area is connected, by an embedded plug and through the first wiring layer, to a gate of an amplifying MOS transistor thereby being converted into a voltage, and is then transferred by a desired wiring to a signal processing circuit.

In such image pickup device, a sensitivity to the light transmitted by the color filter layer 121 varies depending on the distance between the color filter layer 121 and the photodiode 100. In order to obtain a constant optical sensitivity among the elements, it is preferable to maintain more uniformly the distance between the color filter layer 121 and the photodiode 100. In a CMOS area sensor 10 produced according to the producing method of the present embodiment, the above-mentioned distance is made more uniform in comparison with the prior technology.

In the following, there will be explained a producing method for the CMOS area sensor 10 having the structure of the present embodiment. In the present embodiment, the embedded plugs of tungsten are formed by a process employing a blanket CVD method and an etch-back method, and by a process employing a blanket CVD method and a CMP method, selected among the insulation films. For this reason, the producing method for the embedded plug will be explained in particular detail.

Figure 2:
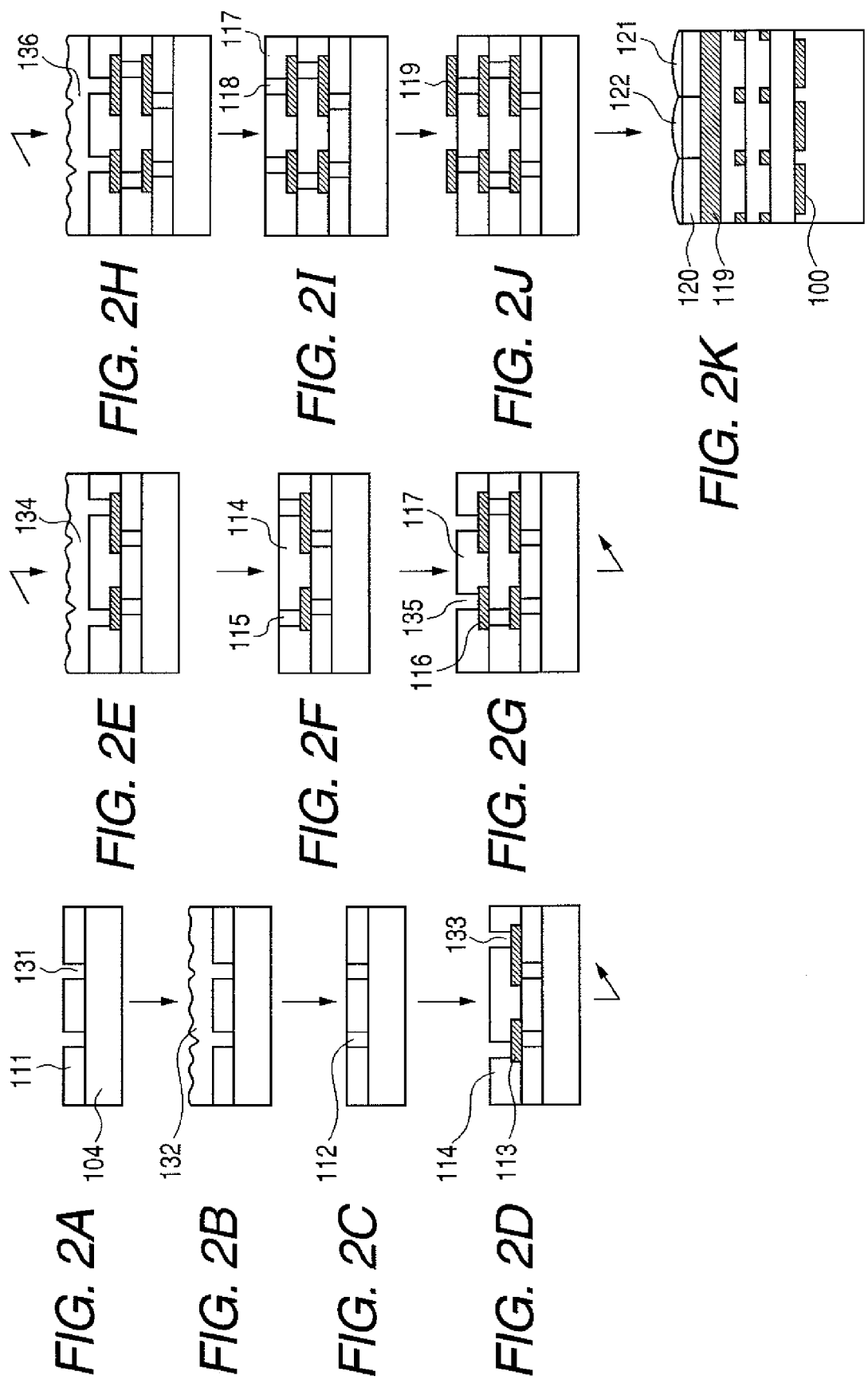
FIGS. 2A, 2B, 2C, 2D, 2E, 2F, 2G, 2H, 2I, 2J and 2K are views showing steps of a producing process for the CMOS area sensor shown in FIG. 1.

FIGS. 2A to 2K illustrate the producing method of the present embodiment in the order of steps, wherein components equivalent to those in FIG. 1 are represented by same numbers. At first, FIG. 2A shows a P-well 104 formed on an N-silicon substrate 103. The N-silicon substrate 103 and the interior of the P-well 104 are omitted for the purpose of simplicity. On the P-well 104, a silicon oxide film was deposited by CVD and polished by CMP method to form a first insulation film 111. Then, in the first insulation film 111, a connecting hole 131 was formed through the first insulation film 111 and extending to the drain area 110, by a photolithographic process and a reactive ion etching (RIE).

Then, as shown in FIG. 2B, a tungsten film 132 was grown on the first insulation film 111 by thermal CVD utilizing tungsten hexafluoride ($WF_6$) as a raw material. Thus the connecting hole 131 was filled with tungsten. Also because of tungsten tilling in the connecting hole 131, a step difference was formed on the connecting hole 131 and on the first insulation film 111.

Then, as shown in FIG. 2C, the tungsten film 132 on the first insulation film 111 and on the connecting hole 131 was partially removed by CMP polishing, whereby a contact plug 112 was formed. At the same time, the surface of the first insulation film was planarized. The first insulation film 111 need not be covered entirely but may be covered at least partially. As the polishing amount by CMP is not uniform within the substrate, the polishing amount in the present embodiment was selected larger than the aforementioned step difference, in order to securely remove the step difference.

Then, as shown in FIG. 2D, an aluminum film was formed by a physical vapor deposition (PVD) method on the planarized surface, and was patterned by a photolithographic process and an etching to form the first wiring layer 113. Then a silicon oxide film was formed by a plasma CVD method, as a second insulation film 114. Then a connecting hole 133 was formed therein by a photolithographic process and an RIE, as in the first insulation film 111.

Then, as shown in FIG. 2E, a tungsten film 134 was grown on the second insulation film 114 by a blanket CVD method. The growing conditions were selected similar to those for the tungsten film 132 on the first insulation film 111. Thus the connecting hole 133 was filled with tungsten. Also a step difference was formed on the connecting hole 133 and on the second insulation film 114, in an extent similar to that on the first insulation film 111.

Then, as shown in FIG. 2F, the tungsten film 134 on the second insulation film 114 and on the connecting hole 133 was removed by CMP polishing, whereby a via plug 115 was formed. The polishing amount was selected larger than the step difference as in the first insulation film 111, in order to securely remove the step difference.

Then, as shown in FIG. 2G, an aluminum layer was formed by a PVD method on the planarized surface, and was patterned by a photolithographic process and an etching to form the second wiring layer 116. Then a silicon oxide film was formed by a plasma CVD method, as a third insulation film 117. Then a connecting hole 135 was formed therein by a photolithographic process and an RIE, as in the first insulation film 111.

Then, as shown in FIG. 2H, a tungsten film 136 was grown on the third insulation film 117 by a blanket CVD method. The growing conditions were selected similar to those for the tungsten film 132 on the first insulation film 111. Thus the connecting hole 135 was filled with tungsten, and a step difference was formed as on the first insulation film 111.

Then, as shown in FIG. 2I, the tungsten film 136 on the third insulation film 117 and the connecting hole 135 was polished and removed by an etch-back method, thereby forming a via plug 118. This is different from the case of the first insulation film 113 and the second insulation film 116 in that the planarization of the tungsten film 136 on the third insulation film 117 was executed by an etch-back method.

For etching back the tungsten film 136, an RIE apparatus having parallel flat electrodes was employed. $SF_6$ was employed as a reactive gas, which was excited to generate a plasma for etching back the tungsten film 136. The etch-back method enabled, in comparison with the planarization with the CMP method, to reduce an unevenness, such as polishing unevenness, in the thickness of the third insulation film 117. The etch-back method, having higher macroscopic planarizing characteristics in comparison with the CMP method, could reduce the thickness unevenness between a central part and a peripheral part of the image pickup area, leading to a sensitivity unevenness in the sensor. Also since the thickness unevenness in the uppermost insulation film in the laminating direction significantly affects the sensor characteristics, the planarizing step for the uppermost insulation film is preferably executed by the etch-back method.

Then, as shown in FIG. 2J, an aluminum layer was formed by a PVD method on the planarized surfacer and was patterned by a photographic method and an etching to form a third wiring layer 119. In the present embodiment, the third wiring layer 119 has a design rule larger than that of the first and second wiring layers. It is therefore possible to reduce the probability of shortcircuiting by a residue generated in the etch-back process for forming the via plug 118.

Then, as shown in FIG. 2K, a passivation film 120 of silicon nitride was formed by a plasma CVD method on the third wiring layer 119. Then a color filter layer 121 and a microlens layer 122 thereon were formed to complete the device structure. In FIG. 2K plural photodiodes 100 are shown.

In general, the etch-back method and the CMP method in the embedded plug formation are different in an interfacial structure constituted of a metal of the embedded plug, a barrier metal formed in the part of the embedded plug and a wiring, because a barrier metal is reconstructed in the CMP method. It is possible, by analyzing the interfacial structure, to judge the structure of the barrier metal, the metal of the embedded plug and the wiring and to identify which method is employed. The barrier metal is formed commonly and is not explained in the present invention.

Second Embodiment

Figure 3:
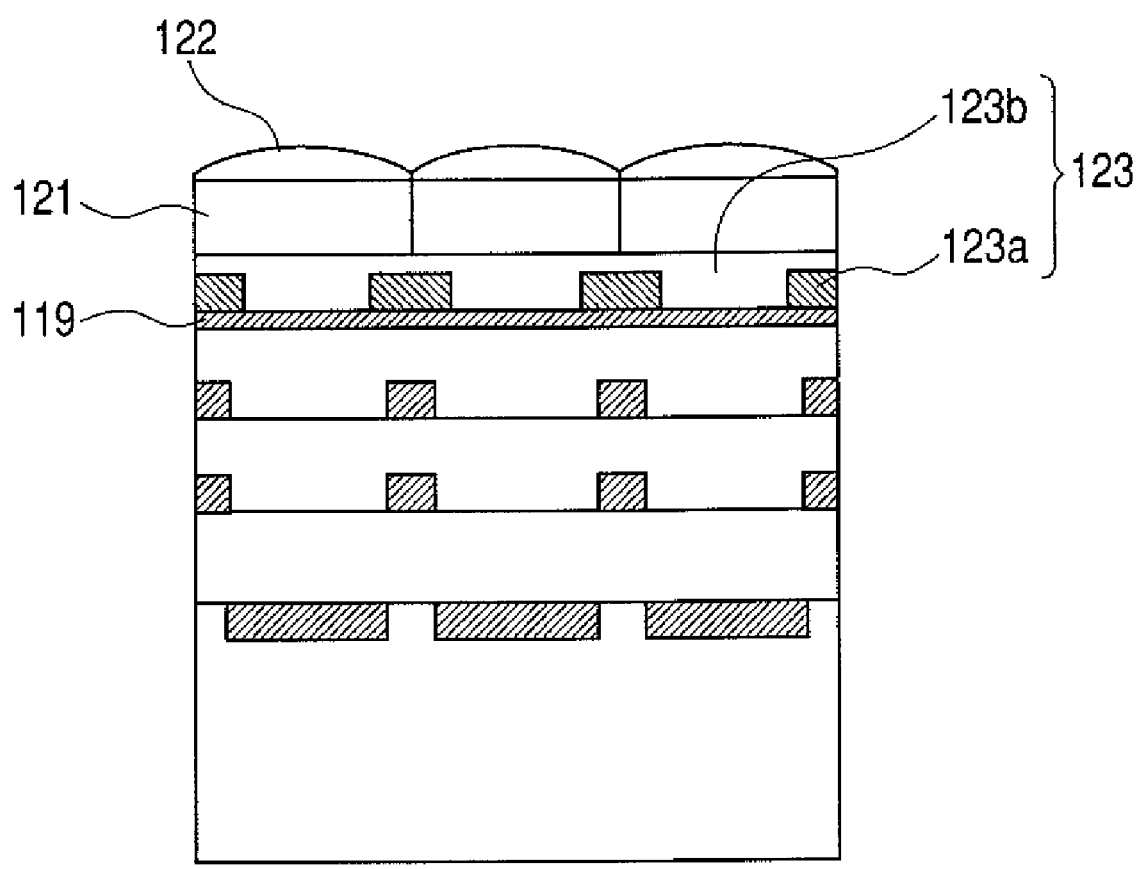
FIG. 3 is a cross-sectional view of a CMOS area sensor of a second embodiment.

In the following, there will be explained a producing method for an image pickup device of a second embodiment. FIG. 3 is a schematic cross-sectional view of a unit element of the image pickup device in the present embodiment. The present embodiment is featured in forming a passivation film 123 of a two-layered structure. A structure from the substrate 103 to the third wiring layer 119 is similar to that in the CMOS area sensor of the first embodiment. The passivation film 123 has a two-layered structure constituted of a first passivation film 123a formed by a silicon oxinitride film and serving as an antireflective film, and a second passivation film 123b of a silicon nitride film formed thereon.

A silicon nitride film is employed as the passivation film 123b because a gas atmosphere in the film forming process is richer in hydrogen. A passivation film rich in hydrogen facilitates a hydrogen termination of an unterminated end (dangling bond) of silicon of the semiconductor substrate, thereby reducing the dangling bonds constituting a source of a dark current. Also as a passivation film, it is preferable to form a silicon nitride film on a silicon oxinitride film, because, as explained in the foregoing, it is rendered possible to reduce a reflection on an interface between a silicon oxide film constituting the third insulation film and a silicon nitride film constituting the passivation film. It is therefore possible, in the CMOS area sensor of the present embodiment, to obtain more uniform spectral characteristics among the photodiodes 100.

The producing method of the present embodiment for the CMOS area sensor is same as that of the first embodiment up to the third wiring layer 119. Thus, also in the present embodiment, the first and second insulation films 111, 114 are planarized by the CMP method, and the third insulation film 117 is planarized by the etch-back method. In the present embodiment, at first a first passivation film 123a of a silicon oxinitride film was formed by a plasma CVD method on the third wiring layer 119. Then a second passivation film 123b of a silicon nitride film was formed by a plasma CVD method. Thereafter a color filter layer 121 and a microlens layer 122 were formed as in the first embodiment to complete an image pickup device.

Figure 4A:
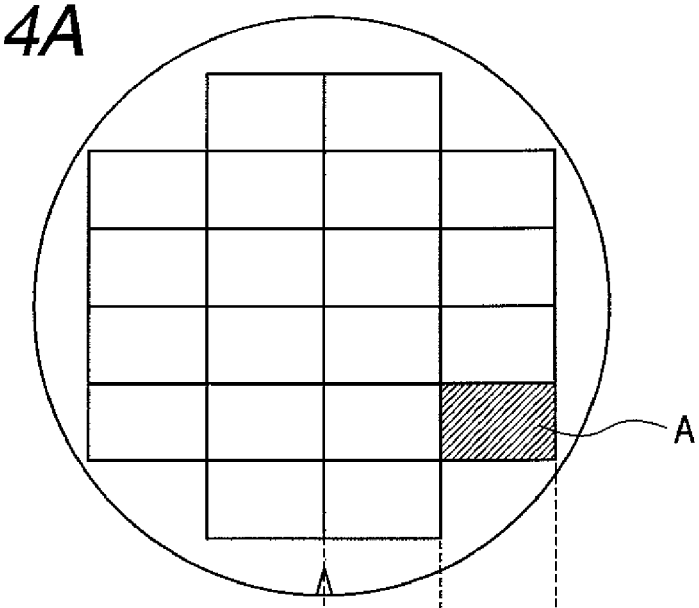
FIGS. 4A and 4B show a distribution of a distance between a color filter and a photodiode in a semiconductor substrate on which plural image pickup device chips are formed.
Figure 4B:
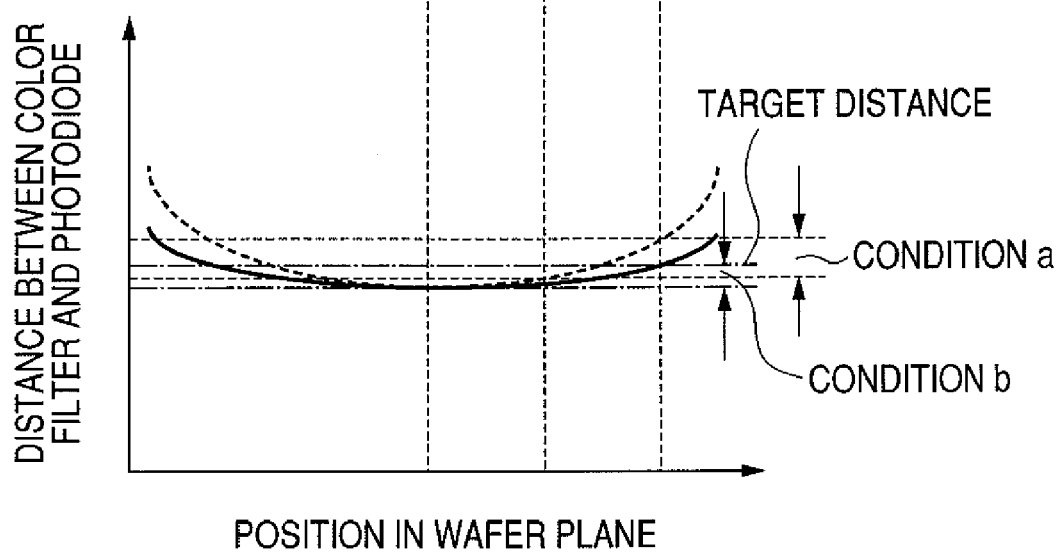

In the following, there will be explained an unevenness in the thickness of the insulation film, in the producing method for the image pickup device explained in the first and second embodiments. FIGS. 4A and 4B show a distribution of a distance between a central part of the color filter layer 121 and a corresponding photodiode 100, measured in different positions of the substrate, when, in the planarizing steps for the insulation films 111, 114, 117 in the embedded plug formation, a CMP method is employed for all the three insulation films 111, 114, 117 (condition a) and when a CMP method is employed for the insulation films 111, 114 and an etch-back method is employed for the insulation 117 (condition b). The substrate in the present embodiment bears 20 CMOS area sensor chips per a semiconductor substrate, and the measurement is conducted on such substrate.

A measurement on the distance between the color filter and the photodiode on a chip A in a peripheral part of the substrate showed, in the condition a, a fluctuation of 10% in the distance between the color filter and the photodiode with respect to a target distance (thickness). In contrast, in the condition b, the fluctuation was lowered to 7%. It is thus confirmed that the condition b of the present invention was superior in the uniformity of the distance between the color filter and the photodiode, to the condition a.

This is because the etch-back method is employed instead of the CMP method, for planarizing the third insulation film 117 thereby suppressing a significant polishing unevenness in the CMP method. The planarization of the first insulation film 111 and the second insulation film 114, at the embedded plug formation, was conducted by the CMP method, giving priority in reducing the probability of shortcircuiting.

On the other hand, the planarization of the uppermost third insulation film 117, at the embedded plug formation, was conducted by the etch-back method, thereby obtaining a more uniform thickness in the entire insulation films. Thus, even if a polishing unevenness is generated in the first insulation film 111 and the second insulation film 114, the thickness of the entire insulation films can be uniformly regulated by the third insulation film 117.

The third wiring layer 119 may have a higher probability of shortcircuiting by tungsten residues, but the probability of shortcircuiting is lowered in the first insulation film 111 and the second insulation film 114, so that such probability becomes lower in the entire device. It is also possible to reduce the probability of shortcircuiting in the third wiring layer 119, in comparison with the first wiring layer 113 and the second wiring layer 116, by employing a design rule not easily causing a shortcircuiting. It is possible, for example, to assign wirings requiring a relatively small design rule such as a drive wiring for the MOS transistor and a signal transfer wiring to the first and second wiring layers, and wirings of a relatively large design rule such as a power supply wiring and a light shielding wiring to the third wiring layer.

Figure 5A:
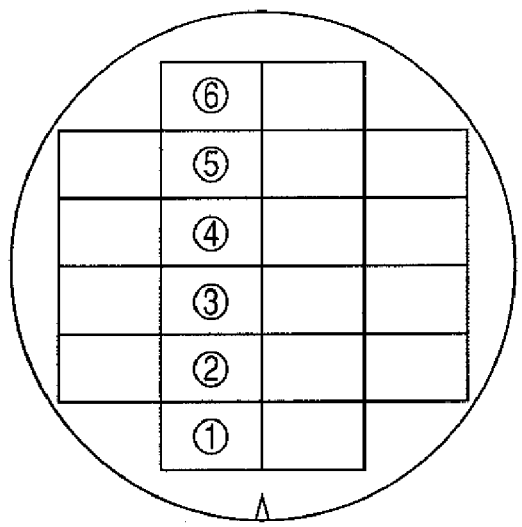
FIGS. 5A and 5B show a distribution in color ratio (greennormalized) in a semiconductor substrate on which plural image pickup device chips are formed.
Figure 5B:
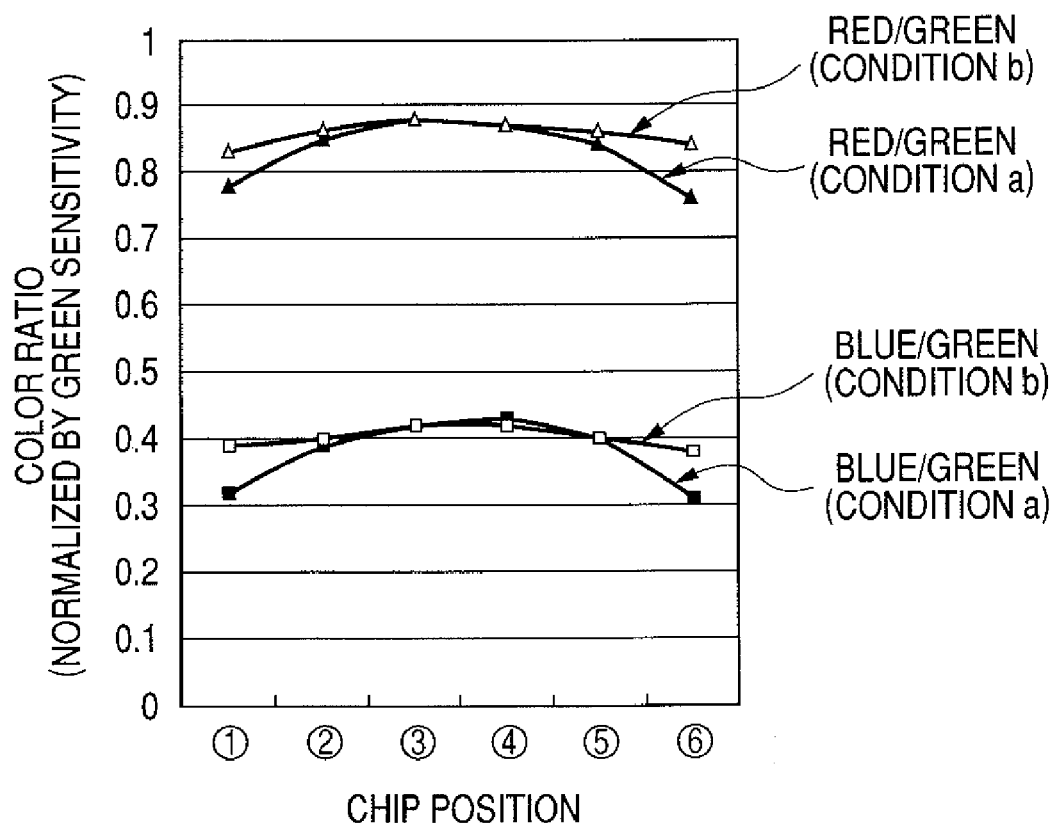

FIGS. 5A and 5B show results of comparison of color unevenness, in the CMOS area sensors prepared under the conditions a and b shown in FIGS. 4A and 4B. FIG. 5A shows positions of the measured chips, and FIG. 5B shows color ratio distributions measured at the chip positions shown in FIG. 5A. The color ratio means a sensitivity ratio for three primary colors (red, blue and green) obtained from the spectral characteristics when a predetermined amount of light is given to each chip, and in the graph shown in FIG. 5B, the sensitivity for each color is normalized by that for the green color. In case the color ratio is constant among all the chips within the substrate, it is possible to produce CMOS area sensors without a color unevenness within each chip. As will be apparent from FIG. 5B, the condition b provides a more uniform color ratio distribution, in comparison with the condition a. It is thus possible to prepare CMOS area sensors of a reduced color unevenness, by selectively adopting the etch-back method and the CMP method for polishing the respective insulation films according to the condition b.

As explained in the foregoing, the producing method of the present invention for the image pickup device allows to suppress a fluctuation in the distance between the color filter and the photodiode, thereby alleviating the deterioration in the sensor characteristics such as color unevenness. It is thus rendered possible to provide an image pickup device of a high reliability and satisfactory sensor characteristics.

The foregoing explanation has been made, as an example, on a CMOS area sensor having a three-layered structure in the wiring layers, but the wiring layers are naturally not limited to the three-layered structure and may have two layers or four or more layers.

Also the present invention is likewise applicable to a semiconductor device having a multi-layered wiring structure and showing an advantage by a reduction in the thickness fluctuation of the insulation layers, for example a device structure employing a junction field effect transistor in addition to the MOS transistor.

This application claims priority from Japanese Patent Application No. 2005-021276 filed on Jan. 28, 2005, which is hereby incorporated by reference herein.

What is claimed is:

1. A method of manufacturing an image pickup device that includes: an image pickup area having plural photoelectric conversion elements arranged in a semiconductor substrate and transistors for transferring electrical signals from the photoelectric conversion elements, and a multi-layer wiring structure arranged above the semiconductor substrate and having wiring layers each having a wiring, plural interlayer insulation films arranged between the wiring layers and between the image pickup area and a wiring layer, and plural buried plugs arranged penetrating respective ones of the interlayer insulation films for electrically connecting wirings mutually adjacent in a direction of lamination or a wiring and a part of the image pickup area, wherein the method comprises:

forming the buried plugs, which includes steps of, for each interlayer insulation film in which a buried plug is to be formed:

forming a connecting hole in the interlayer insulation film;

depositing a metal layer on the interlayer insulation film, so as to bury an interior of the connecting hole and to cover at least a part of an upper surface of the interlayer insulation film in a laminating direction thereof; and removing at least a part of the metal layer on the upper surface of the interlayer insulation film to form the buried plug, wherein the step of removing at least a part of the metal layer is executed by an etch-back method on a buried plug in at least one uppermost interlayer insulation film in the laminating direction and by a chemical mechanical polishing method on a buried plug in an interlayer insulation film different from the at least one uppermost interlayer insulation film.

2. A method of manufacturing an image pickup device according to claim 1, wherein, in forming a buried plug in at least the uppermost interlayer insulation film in the laminating direction, the step of depositing the metal layer utilizes a chemical vapor deposition method.

3. A method of manufacturing an image pickup device according to claim 1, wherein, for a buried plug that is not formed in any of a plurality of uppermost interlayer insulation films in the laminating direction, the step of removing at least part of the metal layer utilizes a chemical mechanical polishing method.

4. A method of manufacturing an image pickup device that includes: an image pickup area having plural photoelectric conversion elements arranged in a semiconductor substrate, transistors for transferring electrical signals from the photoelectric conversion elements, and a multi-layer wiring structure arranged above the semiconductor substrate and having wiring layers each having a wiring, plural interlayer insulation films arranged between the wiring layers and between the image pickup area and a wiring layer, plural buried plugs arranged penetrating respective ones of the interlayer insulation films for electrically connecting wirings mutually adjacent in a lamination direction or a wiring and a part of the image pickup area, and a passivation layer arranged on an uppermost insulation film in the laminating direction, wherein the method comprises:

forming the buried plugs, which includes steps of, for each interlayer insulation film in which a buried plug is to be formed:

forming a connecting hole in the interlayer insulation film;

depositing a metal layer on the interlayer insulation film, so as to bury an interior of the connecting hole and to cover at least a part of an upper surface of the interlayer insulation film in a laminating direction thereof;

removing at least a part of the metal layer on the upper surface of the interlayer insulation film to form the buried plug, wherein the step of removing at least a part of the metal layer is executed by an etch-back method on a buried plug in at least one uppermost interlayer insulation film in the laminating direction and by a chemical mechanical polishing method on a buried plug in an interlayer insulation film different from the at least one uppermost interlayer insulation film; and forming a passivation layer on the uppermost interlayer insulation film in the laminating direction.

5. A method of manufacturing an image pickup device according to claim 4, wherein, in forming a buried plug in at least the uppermost interlayer insulation in the laminating direction, the step of depositing the metal layer utilizes a chemical vapor deposition method.

6. A method of manufacturing an image pickup device according to claim 4, wherein, for a buried plug that is formed in an interlayer insulation film that is not among a plurality of uppermost interlayer insulation films in the laminating direction, the step of removing at least a part of the metal layer utilizes a chemical mechanical polishing method.

7. A method of manufacturing an image pickup device according to claim 4, wherein the passivation layer includes a silicon nitride film.

8. A method of manufacturing an image pickup device according to claim 4, wherein the forming of the buried plugs further includes a step of forming, between the passivation layer and the uppermost interlayer insulation film in the laminating direction, an antireflection film for reducing a reflection at an interface between the passivation layer and the uppermost interlayer insulation film.

* * * * *

UNITED STATES PATENT AND TRADEMARK OFFICE
CERTIFICATE OF CORRECTION

PATENT NO.       : 7,393,715 B2
APPLICATION NO.  : 11/275672
DATED            : July 1, 2008
INVENTOR(S)      : Koichi Tazoe et al.

It is certified that error appears in the above-identified patent and that said Letters Patent is hereby corrected as shown below:

<u>COLUMN 2</u>

Line 14, "matters" should read --matter--.
Line 38, "the each" should read --each of the--.
Line 46, "comprises:" should read --comprising:--.

<u>COLUMN 4</u>

Line 34, "pixelby" should read --pixel by--.
Line 66, "a upper most" should read --an uppermost--.

<u>COLUMN 6</u>

Line 17, "tilling" should read --filling--.

Signed and Sealed this

Second Day of December, 2008

JON W. DUDAS
*Director of the United States Patent and Trademark Office*